(12) United States Patent
Zhang et al.

(10) Patent No.: US 9,083,282 B2
(45) Date of Patent: Jul. 14, 2015

(54) APPARATUS AND METHODS FOR POWER AMPLIFIERS

(71) Applicant: SKYWORKS SOLUTIONS, INC., Woburn, MA (US)

(72) Inventors: Guohao Zhang, Irvine, CA (US); Hardik Bhupendra Modi, Irvine, CA (US); Sabah Khesbak, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 253 days.

(21) Appl. No.: 13/666,627

(22) Filed: Nov. 1, 2012

(65) Prior Publication Data
US 2013/0116017 A1 May 9, 2013

Related U.S. Application Data

(60) Provisional application No. 61/555,754, filed on Nov. 4, 2011.

(51) Int. Cl.
*H03F 3/04* (2006.01)
*H03F 1/02* (2006.01)
*H04B 1/04* (2006.01)
*H03F 1/56* (2006.01)
*H03F 3/19* (2006.01)

(52) U.S. Cl.
CPC .............. *H03F 1/0222* (2013.01); *H03F 1/565* (2013.01); *H03F 3/19* (2013.01); *H04B 1/0458* (2013.01); *H03F 2200/102* (2013.01); *H03F 2200/108* (2013.01); *H03F 2200/387* (2013.01)

(58) Field of Classification Search
USPC .......................................... 330/302, 305, 250
IPC ............................................................ H03F 3/04
See application file for complete search history.

(56) References Cited

U.S. PATENT DOCUMENTS 5,300,895 A * 4/1994 Jones ............................ 330/251
5,347,229 A 9/1994 Suckling et al.
(Continued)

FOREIGN PATENT DOCUMENTS

WO WO 2010-134858 11/2010

OTHER PUBLICATIONS

B.K. et al., *Envelope Tracking Technique for Multimore PA Operation*, In: Proceedings of the 39th European Microwave Conference, Sep. 29-Oct. 1, 2009, pp. 429-432.
(Continued)

*Primary Examiner* — Patricia T Nguyen
(74) *Attorney, Agent, or Firm* — Knobbe, Martens, Olson & Bear, LLP

(57) ABSTRACT

Apparatus and methods for power amplifiers are disclosed. In one embodiment, a power amplifier circuit assembly includes a power amplifier and an impedance matching network. The impedance matching network is operatively associated with the power amplifier and is configured to provide a load line impedance to the power amplifier between about 6 Ω and about 10 Ω. The impedance matching network includes a fundamental matching circuit and one or more termination circuits, and the fundamental matching circuit and each of the of the one or more termination circuits include separate input terminals for coupling to an output of the power amplifier so as to allow the fundamental matching circuit and each of the one or more termination circuits to be separately tuned.

27 Claims, 8 Drawing Sheets

(56) References Cited

U.S. PATENT DOCUMENTS

| | | | |
|---|---|---|---|
| 6,384,688 | B1 | 5/2002 | Fujioka et al. |
| 6,577,199 | B2 * | 6/2003 | Dent .............................. 330/302 |
| 7,372,334 | B2 | 5/2008 | Blair et al. |
| 8,164,387 | B1 * | 4/2012 | Apel et al. .................... 330/276 |
| 8,797,103 | B2 * | 8/2014 | Kaczman et al. ............. 330/307 |
| 2007/0024374 | A1 | 2/2007 | Blair et al. |
| 2007/0057731 | A1 | 3/2007 | Le |
| 2010/0253435 | A1 | 10/2010 | Ichitsubo et al. |
| 2013/0029619 | A1 * | 1/2013 | Zhang et al. ............... 455/127.2 |

OTHER PUBLICATIONS

J.K. et al., *A Highly Linear and Efficient Differential CMOS Power Amplifier With Harmonic Control*, In: IEEE Journal of Solid-State Circuits, vol. 41, No. 6, Jun. 2006, pp. 1314-1322.

Y.Y.W. et al., *Analysis and Experiments for High Efficiency Class-F and Inverse Class-F Power Amplifiers*, In: IEEE Transactions on Microwave Theory and Techniques, vol. 54, No. 5, May 2006, pp. 1969-1974.

Search Report and Written Opinion of Mar. 11, 2013 for International Application No. PCT/US2012/062828, 10 pages.

Spirito, M., et al., "Experimental Procedure to Optimize Out-of-Band Terminations for Highly Linear and Power Efficient Bipolar Class-AB RF Amplifiers", IEEE BCTM 7.3, 2005, pp. 112-115.

Collinson, Glenn, et al., "Effects of Harmonic Terminations on Power and Efficiency of GAAS HBT Power Amplifiers at 900MHZ", IEE Colloquium on Solid-State Power Amplifiers, Dec. 16, 1991, pp. 12/1-12/5.

\* cited by examiner

APPARATUS AND METHODS FOR POWER AMPLIFIERS

CROSS-REFERENCE TO RELATED APPLICATIONS

This application claims the benefit of priority under 35 U.S.C. §119(e) of U.S. Provisional Patent Application No. 61/555,754, filed Nov. 4, 2011 entitled "APPARATUS AND METHODS FOR POWER AMPLIFIERS", which is herein incorporated by reference in its entirety.

BACKGROUND

1. Field

Embodiments of the invention relate to electronic systems, and in particular, to power amplifiers for radio frequency (RF) electronics.

2. Description of the Related Technology

Power amplifiers can be included in mobile devices to amplify a RF signal for transmission via an antenna. For example, in mobile devices having a time division multiple access (TDMA) architecture, such as those found in Global System for Mobile Communications (GSM), code division multiple access (CDMA), and wideband code division multiple access (W-CDMA) systems, a power amplifier can be used to amplify a RF signal having a relatively low power. It can be important to manage the amplification of a RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

The power consumption of a power amplifier can be an important consideration. One technique for reducing power consumption of a power amplifier is envelope tracking, in which the voltage level of the power supply of the power amplifier is controlled in relation to the envelope of the RF signal. Thus, when the envelope of the RF signal increases, the voltage supplied to the power amplifier can be increased. Likewise, when the envelope of the RF signal decreases, the voltage supplied to the power amplifier can be decreased to reduce power consumption.

There is a need for improved power amplifier systems. Furthermore, there is a need for power amplifiers having improved power efficiency.

SUMMARY

In certain embodiments, the present disclosure relates to a power amplifier circuit assembly including a power amplifier and an impedance matching network operatively associated with the power amplifier. The power amplifier includes an input configured to receive a radio frequency signal having a fundamental frequency and an output configured to generate an amplified radio frequency signal. The impedance matching network is configured to provide a load line impedance between about 6 Ω and about 10 Ω at the fundamental frequency. The impedance matching network includes a fundamental matching circuit and one or more termination circuits, and the fundamental matching circuit and each of the of the one or more termination circuits include separate input terminals for coupling to the output of the power amplifier so as to allow the fundamental matching circuit and each of the one or more termination circuits to be separately tuned.

In various embodiments, the one or more termination circuits include a second harmonic termination circuit and a third harmonic termination circuit.

In various embodiments, the power amplifier circuit assembly further includes an envelope tracker configured to generate a power supply voltage for the power amplifier. In certain embodiments, the power amplifier circuit assembly further includes a bias network for supplying the power amplifier with the power supply voltage, and the bias network includes a choke inductor electrically connected between the envelope tracker and the power amplifier and a bypass capacitor electrically connected between the power supply voltage and a ground node. In some embodiments, the bypass capacitor has a capacitance in the range of about 50 pF to about 200 pF.

According to a number of embodiments, the power amplifier circuit assembly further includes an input bias circuit configured to generate a bias current for the input of the power amplifier. The input bias circuit is configured to decrease a magnitude of the bias current when a power level of the amplified radio frequency signal decreases.

In certain embodiments, the present disclosure relates to a mobile device including a power amplifier having an input and an output, an impedance matching network operatively associated with the power amplifier, an antenna electrically connected to the output of the power amplifier through the impedance matching circuit, and an envelope tracker configured to generate a power supply voltage for the power amplifier. The input of the power amplifier is configured to receive a radio frequency signal having a fundamental frequency and the output of the power amplifier is configured to generate an amplified radio frequency signal. The impedance matching network is configured to provide a load line impedance between about 6 Ω and about 10 Ω at the fundamental frequency, and the impedance matching network includes a fundamental matching circuit and one or more termination circuits. The fundamental matching circuit and each of the of the one or more termination circuits include separate input terminals for coupling to the output of the power amplifier so as to allow the fundamental matching circuit and each of the one or more termination circuits to be separately tuned.

In various embodiments, the mobile device further includes a bias network for supplying the power amplifier with the power supply voltage, and the bias network includes a choke inductor electrically connected between the envelope tracker and the power amplifier and a bypass capacitor electrically connected between the power supply voltage and a ground node. In some embodiments, the bypass capacitor has a capacitance in the range of about 50 pF to about 200 pF.

According to a number of embodiments, the fundamental matching circuit and each of the one or more termination circuits are electrically connected to the power amplifier using different bond wires.

In various embodiments, the one or more termination circuits include a second harmonic termination circuit and a third harmonic termination circuit.

According to several embodiments, the mobile device further includes a transceiver configured to generate the radio frequency input signal.

In some embodiments, the mobile device further includes an input bias circuit configured to generate a bias current for the input of the power amplifier. The input bias circuit is configured to decrease a magnitude of the bias current when a power level of the amplified radio frequency signal decreases.

In certain embodiments, the present disclosure relates to a multi-chip module including a substrate, an input pin configured to receive a radio frequency signal having a fundamental frequency, a power amplifier die mounted on the substrate, and an impedance matching network disposed on the substrate. The power amplifier die includes an input electrically connected to the input pin and an output configured to generate an amplified radio frequency signal. The impedance matching network is electrically connected to the output of the power amplifier, and the impedance matching network includes an inductive circuit component and a capacitive circuit component configured to provide a load line impedance between about 6 Ω and about 10 Ω at the fundamental frequency. The impedance matching network further includes a fundamental matching circuit and one or more termination circuits, and the fundamental matching circuit and each of the of the one or more termination circuits include separate input terminals for coupling to the output of the power amplifier so as to allow the fundamental matching circuit and each of the one or more termination circuits to be separately tuned.

In various embodiments, the capacitive circuit component, is formed from a surface mount component mounted on the substrate.

In some embodiments, the inductive circuit component includes a spiral inductor formed from a conductive trace of the substrate.

In a number of embodiments, the inductive circuit component includes a surface mount component mounted to the substrate.

In according with several embodiments, the multi-chip module further includes a power supply pin and a ground pin, and the power supply pin is configured to receive a power supply voltage from an envelope tracker. In various embodiments, the multi-chip module further includes a bias network for supplying the power amplifier with the power supply voltage, and the bias network includes a choke inductor electrically connected between the power supply pin and the power amplifier and a bypass capacitor electrically connected between the power supply pin and the ground pin. In some embodiments, the bypass capacitor has a capacitance in the range of about 50 pF to about 200 pF.

In various embodiments, the fundamental matching circuit and each of the one or more termination circuits are electrically connected to the power amplifier die using different bond wires.

In according with certain embodiments, the fundamental matching circuit and each of the one or more termination circuits are electrically connected to the power amplifier die using different pads of the power amplifier die.

In some embodiments, the multi-chip module further includes a power amplifier bias die disposed on the substrate and configured to provide a bias signal for controlling a quiescent current of the power amplifier die.

In certain embodiments, the present disclosure relates to a tuning circuit assembly for use in a power amplifier system. The tuning circuit assembly includes an impedance matching network operatively associated with a power amplifier and configured to provide a load line impedance between about 6 Ω and about 10 Ω. The impedance matching network includes a fundamental matching circuit and one or more termination circuits, and the fundamental matching circuit and each of the of the one or more termination circuits include separate terminals for coupling to an output of the power amplifier so as to allow the fundamental matching circuit and each of the one or more termination circuits to be separately tuned. The tuning circuit assembly further includes a biasing network operative associated with said impedance matching network. The biasing network is operatively associated with an envelope tracker and configured to provide a bypass capacitance in the range of about 50 pF to about 200 pF.

In various embodiments, the one or more termination circuits includes a plurality of termination circuits for even harmonics but does not include any termination circuits for odd harmonics.

In some embodiments, the one or more termination circuits include a plurality of termination circuits for odd harmonics but do not include any termination circuits for even harmonics.

In certain embodiments, the one or more termination circuits include a second harmonic termination circuit and a third harmonic termination circuit.

DETAILED DESCRIPTION OF EMBODIMENTS

The headings provided herein, if any, are for convenience only and do not necessarily affect the scope or meaning of the claimed invention.

Overview of Power Amplifier Systems

Figure 1:
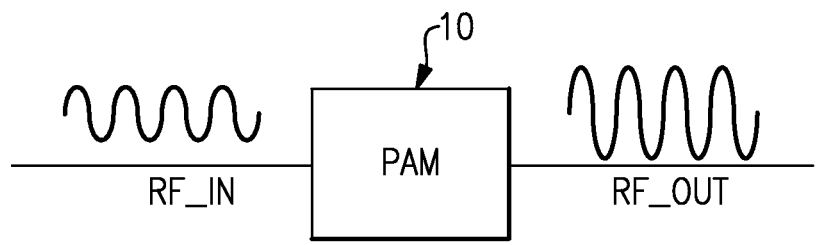
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module 10 can be configured to amplify an RF signal RF_IN to generate an amplified RF signal RF_OUT. As described herein, the power amplifier module 10 can include one or more power amplifiers.

Figure 2:
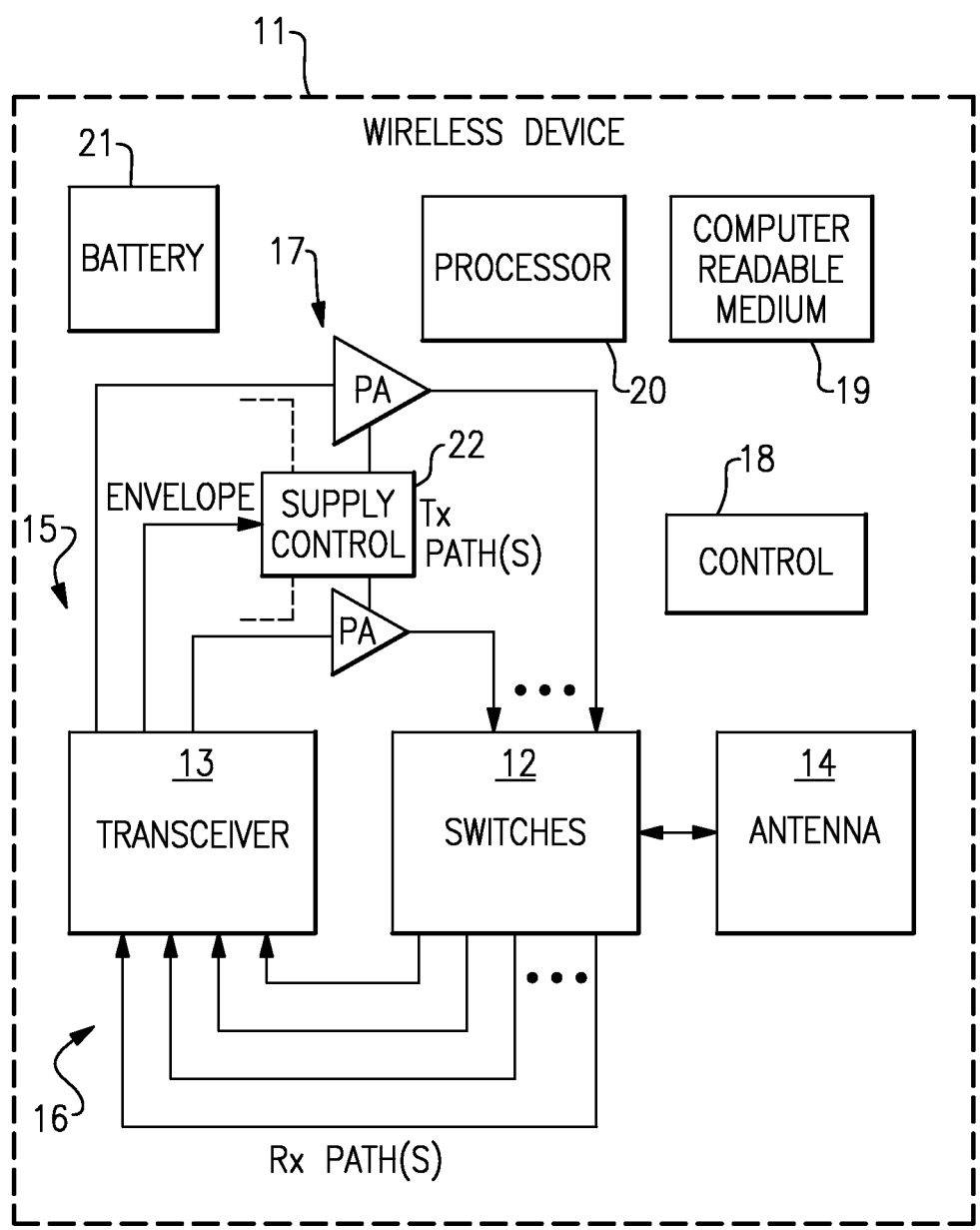
FIG. 2 is a schematic block diagram of an example wireless device that can include one or more of the power amplifier modules of FIG. 1.

FIG. 2 is a schematic block diagram of an example wireless device 11 that can include one or more of the power amplifier modules 10 of FIG. 1. The wireless device 11 can implement one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

One or more features of the present disclosure can be implemented in the foregoing example modes and/or bands, and in other communication standards. For example, 3G, 4G, LTE, and Advanced LTE are non-limiting examples of such standards.

In certain embodiments, the wireless device 11 can include switches 12, a transceiver 13, an antenna 14, power amplifiers 17, a control component 18, a computer readable medium 19, a processor 20, a battery 21, and a supply control block 22.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates the wireless device 11 as including two transmission paths 15, the wireless device 11 can be adapted to include more or fewer transmission paths 15.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 2 illustrates the wireless device 11 as including four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17, the supply control block 22, and/or other operating components.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The illustrated wireless device 11 also includes the supply control block 22, which can be used to provide a power supply voltage to one or more of the power amplifiers 17. For example, the supply control block 22 can include an envelope tracker configured to control or vary the voltage level of the supply voltage provided to the power amplifiers 17 based upon an envelope of the RF signal to be amplified. However, in certain implementations the supply control block 22 can include different components.

The supply control block 22 can be electrically connected to the battery 21, and the supply control block 22 can be configured to generate the supply voltage for the power amplifiers 17. The battery 21 can be any suitable battery for use in the wireless device 11, including, for example, a lithium-ion battery. As will be described in detail further below, by varying the voltage provided to the power amplifiers, the power consumed from the battery 21 can be reduced, thereby improving performance of the battery life of the wireless device 11. In certain implementations, the supply control block 22 can control the power amplifier supply voltage based on an envelope of the RF signal to be amplified. The envelope signal can be provided to the supply control block 22 from the transceiver 13. However, the envelope can be determined in other ways. For example, the envelope can be determined by detecting the envelope from the RF signal using any suitable envelope detector.

Figure 3:
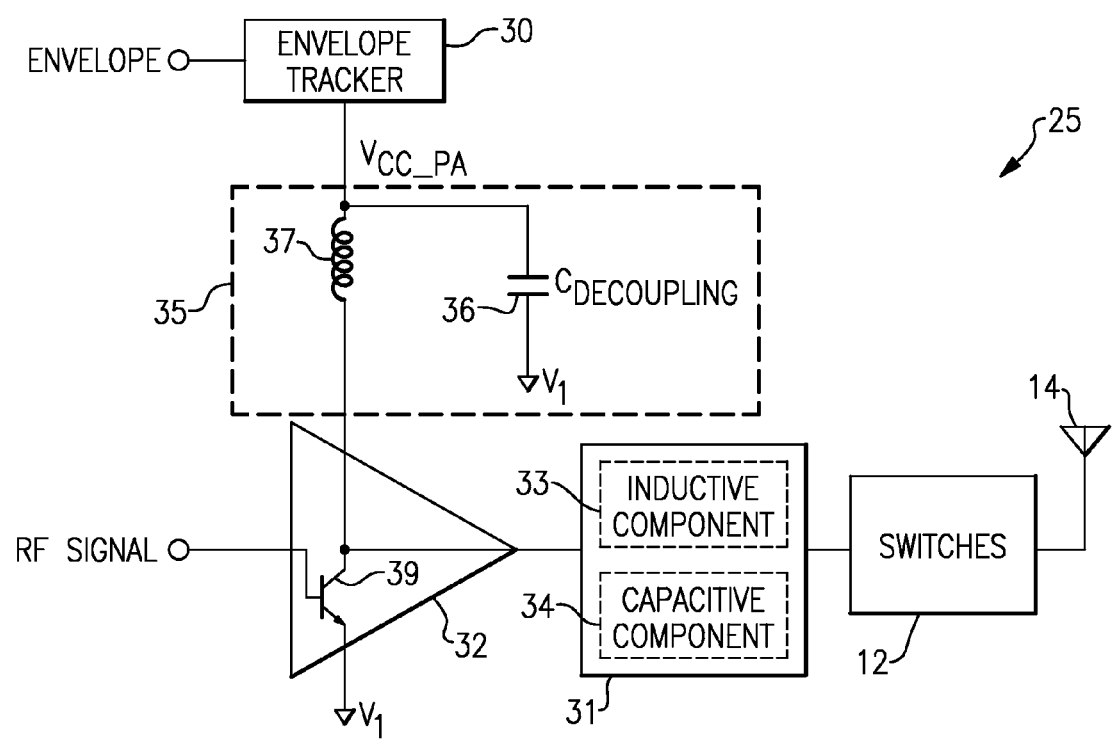
FIG. 3 is a schematic block diagram of one example of a power amplifier system including an envelope tracker.

FIG. 3 is a schematic block diagram of one example of a power amplifier system 25 including an envelope tracker 30. The illustrated power amplifier system 25 includes the switches 12, the antenna 14, the envelope tracker 30, an impedance matching network 31, a power amplifier 32, and a bias network 35. The impedance matching network 31 includes an inductive circuit component 33 and a capacitive circuit component 34, and the bias network 35 includes a decoupling or bypass capacitor 36 and an inductor 37.

The illustrated envelope tracker 30 is configured to receive an envelope of the RF signal and to generate a power amplifier supply voltage $V_{CC\_PA}$ for the power amplifier 32 that changes in relation to the envelope signal over time. In some implementations the power amplifier supply voltage $V_{CC\_PA}$ can have a minimum voltage in the range of about 0.5 V to about 0.7 V, and a maximum voltage in the range of about 5 V to about 5.5 V. Thus, in contrast to a conventional power amplifier system that can have a fixed voltage of, for example, about 3.4 V, the power amplifier system 25 can have a power amplifier supply voltage $V_{CC\_PA}$ that dynamically changes in relation to the envelope of the RF signal.

The illustrated power amplifier 32 includes a bipolar transistor 39 having an emitter, a base, and a collector. The emitter of the bipolar transistor 39 can be electrically connected to a first supply voltage $V_1$, which can be, for example, a ground node. Additionally, a radio frequency (RF) signal can be provided to the base of the bipolar transistor 39 such that the bipolar transistor 39 amplifies the RF signal and provides the amplified RF signal at the collector. The bipolar transistor 39 can be any suitable device. In one implementation, the bipolar transistor 39 is a heterojunction bipolar transistor (HBT).

The power amplifier 32 can be configured to provide the amplified RF signal to the switches 12. The impedance matching network 31 can be used to terminate the electrical connection between the power amplifier 32 and the switches 12. For example, the impedance matching network 31 can be used to increase power transfer and/or reduce reflections of the amplified RF signal generated using the power amplifier 32. The impedance matching network 31 includes the inductive component 33 and the capacitive component 34, which can be configured to achieve a desired impedance characteristic versus frequency.

The bias network 35 can be included to aid in biasing the power amplifier 32 with the power amplifier supply voltage $V_{CC\_PA}$ generated by the envelope tracker 30. The inductor 37 can include a first end electrically connected to the envelope tracker 30 and a second end electrically connected to the collector of the bipolar transistor 39. The inductor 37 can be used to provide the power amplifier supply voltage $V_{CC\_PA}$ to the power amplifier 32 while choking or blocking high frequency RF signal components. The decoupling capacitor 36 includes a first end electrically connected to the first end of the inductor 37 and a second end electrically coupled to the first supply voltage $V_1$. The decoupling capacitor 36 can provide a low impedance path to high frequency signals, thereby reducing the noise of the power amplifier supply voltage $V_{CC\_PA}$, improving power amplifier stability, and/or improving the performance of the inductor 37 as a RF choke. In certain implementations described herein, the decoupling capacitor 36 can be configured to have a relatively small capacitance relative to a conventional power amplifier decoupling capacitor.

Although FIG. 3 illustrates one implementation of the power amplifier 32, skilled artisans will appreciate that the teachings described herein can be applied to a variety of power amplifier structures, such as multi-stage power amplifier structures and power amplifiers employing other transistor structures. For example, in some implementations the bipolar transistor 39 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor.

Figure 4A:
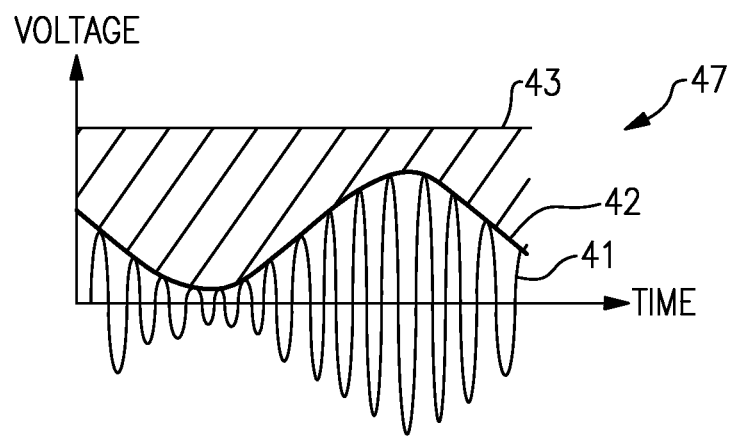
FIGS. 4A and 4B show two examples of power supply voltage versus time.
Figure 4B:
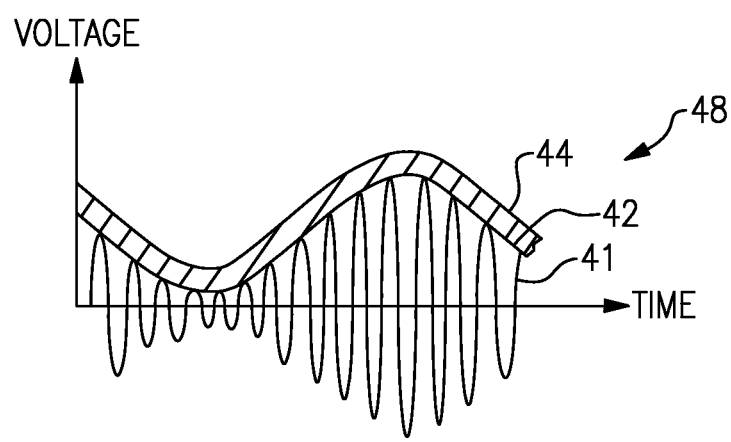

FIGS. 4A and 4B show two examples of power supply voltage versus time.

In FIG. 4A, a graph 47 illustrates the voltage of an RF signal 41 and a power amplifier supply voltage 43 versus time. The RF signal 41 has an envelope 42.

It can be important that the power supply voltage 43 of a power amplifier has a voltage greater than that of the RF signal 41. For example, providing a power supply voltage to a power amplifier having a magnitude less than that of the RF signal 41 can clip the RF signal, thereby creating signal distortion and/or other problems. Thus, it can be important the power supply voltage 43 be greater than that of the envelope 42. However, it can be desirable to reduce a difference in voltage between the power amplifier supply voltage 43 and the envelope 42 of the RF signal 41, as the area between the power supply voltage 43 and the envelope 42 can represent lost energy, which can reduce battery life and increase heat generated in a mobile device.

In FIG. 4B, a graph 48 illustrates the voltage of an RF signal 41 and a power amplifier supply voltage 44 versus time. In contrast to the power amplifier supply voltage 43 of FIG. 4A, the power amplifier supply voltage 44 of FIG. 4B varies in relation to the envelope 42 of the RF signal 41. The area between the power amplifier supply voltage 44 and the envelope 42 in FIG. 4B is less than the area between the power amplifier supply voltage 43 and the envelope 42 in FIG. 4A, and thus the graph 48 of FIG. 4B can be associated with a power amplifier system having greater energy efficiency.

Figure 5:
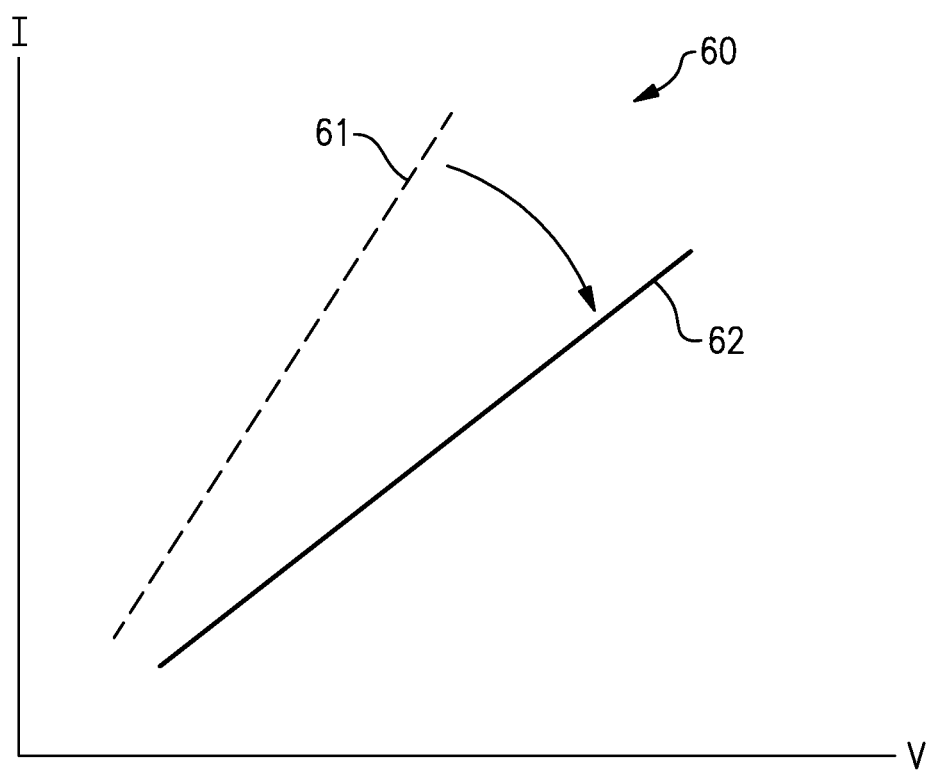
FIG. 5 shows two examples of load line current versus voltage.

FIG. 5 shows two examples of load line current versus voltage. The graph 60 can represent a current versus voltage relationship of an impedance matching network at a given frequency, such as a fundamental frequency of an amplified RF signal generated by a power amplifier.

Power added efficiency (PAE) is one metric for rating a power amplifier, and can correspond to the ratio of the difference between the output and input signal power to the DC power consumed by the power amplifier. Linearity is another metric for rating a power amplifier, and can be rated in a variety of ways including, for example, by measuring adjacent channel power ratio (ACPR) and/or by determining an input signal power level that causes a small-signal gain of the power amplifier to drop by about 1 dB. PAE and/or linearity can be metrics by which customers determine which power amplifiers to purchase, as PAE can impact battery life of an electronic device and linearity can impact signal quality of the electronic device. Although high PAE and high linearity are desirable, improving PAE can come at the cost of reducing linearity, while increasing linearity can cause a decrease in PAE.

A load line electrically connected to an output of a power amplifier can impact PAE and linearity of the power amplifier. For example, increasing the impedance of the load line can increase the PAE of the power amplifier and reduce the linearity of the power amplifier, while decreasing the impedance of the load line can increase the linearity of the power amplifier and reduce the PAE of the power amplifier.

The graph 60 includes a first plot 61 of load line current versus voltage and a second plot 62 of load line current versus voltage. As shown in FIG. 5, the first plot 61 has a relatively sharper or steeper slope than the second plot 62, and thus the first plot 61 is associated with an impedance matching network having lower load line impedance than an impedance matching network associated with the second plot 62. For example, the first plot 61 can be associated with a load line impedance of about 4 Ω, while the second plot 62 can be associated with a load line impedance of about 8 Ω. The first plot 61 also has a higher current for a given voltage than the second plot 61, and thus the first plot 61 can be associated with a power amplifier having a lower PAE than a power amplifier associated with the second plot 62.

In certain implementations described herein, a power amplifier system includes an impedance matching network tuned to have a relatively high load line impedance at a fundamental frequency of an RF signal amplified by the power amplifier system relative to that of a conventional power amplifier system. For example, in some implementations the impedance matching network is configured to have a load impedance at the fundamental frequency that is in the range of about 6 Ω to about 10 Ω, for example, about 8 Ω. By increasing the load line impedance of the power amplifier, the current draw of the power amplifier can be reduced, thereby by improving power efficiency.

Although increasing the load line impedance of the power amplifier can reduce linearity of the power amplifier, the power amplifier system can be configured to meet or exceed a linearity rating by including an envelope tracker for controlling a supply voltage of the power amplifier. For example, the envelope tracker can not only improve power efficiency by controlling supply voltage in relation to an envelope signal as was described above with reference to FIG. 4B, but the envelope tracker can also improve the linearity of the power amplifier system by controlling the voltage of the power amplifier output in relation to the envelope signal. For instance, since the envelope tracker changes the DC voltage of the power amplifier output based on a low frequency component of the RF signal, the envelope tracker can improve the linearity of the power amplifier by changing the voltage of the power amplifier output at the envelope frequency.

Figure 6:
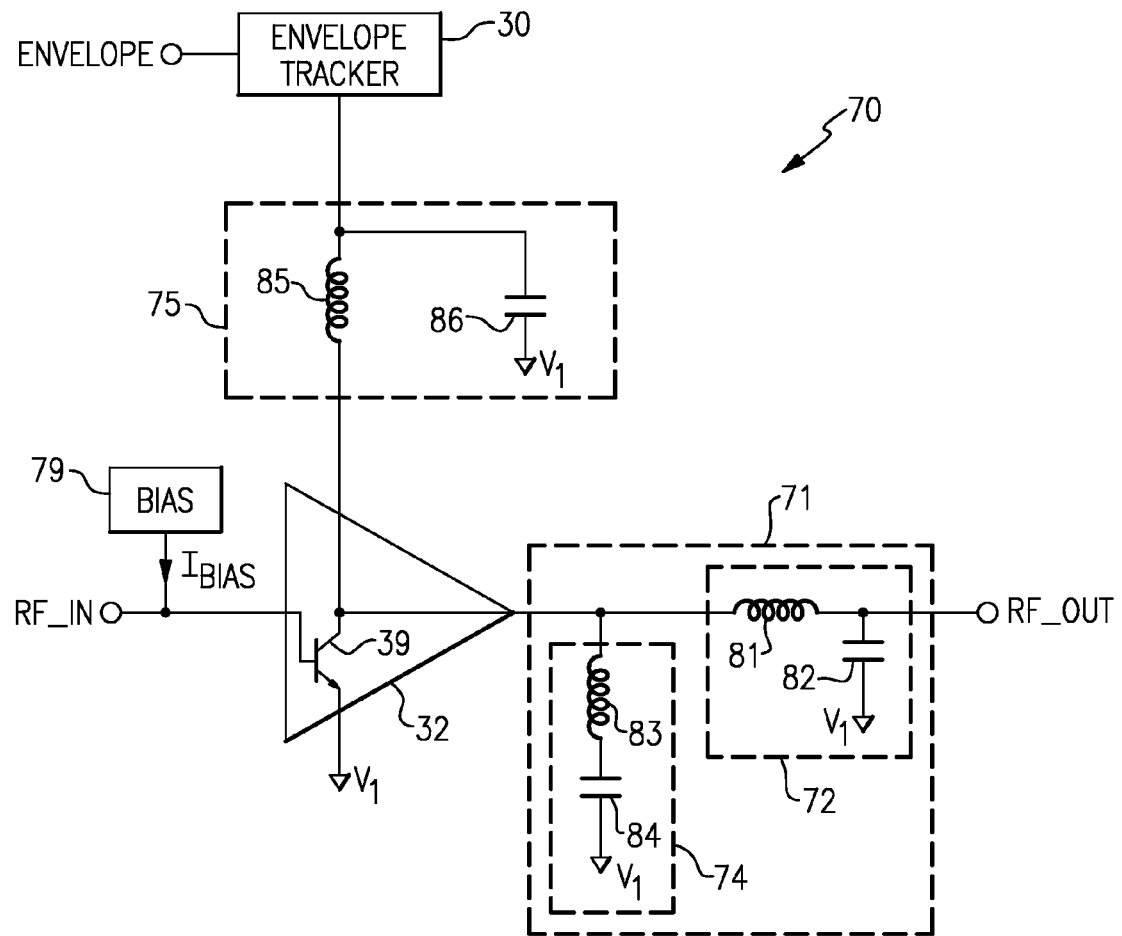
FIG. 6 is a schematic block diagram of another example of a power amplifier system including an envelope tracker.

FIG. 6 is a schematic block diagram of another example of a power amplifier system 70 including an envelope tracker 30. The illustrated power amplifier system 70 includes the envelope tracker 30, the power amplifier 32, an impedance matching network 71, a bias network 75, and a power amplifier input bias circuit 79. The impedance matching network 71 includes a fundamental matching circuit 72 and a second harmonic termination circuit 74. The envelope tracker 30 is configured to receive an envelope of the RF signal and to generate a power amplifier supply voltage $V_{CC\_PA}$ for the power amplifier 32. The power amplifier 32 is configured to receive a RF signal on the input terminal RF_IN and to generate an amplified RF signal on the output terminal RF_OUT.

The illustrated power amplifier 32 includes a bipolar transistor 39 having an emitter, a base, and a collector. The emitter of the bipolar transistor 39 can be electrically connected to a first supply voltage $V_1$, which can be, for example, a ground node. Additionally, the base of the bipolar transistor 39 is electrically connected to the input terminal RF_IN, which can be used to provide a RF signal to the power amplifier 32. Additionally, the base of the bipolar transistor 39 is configured to receive a bias current $I_{BIAS}$ from the power amplifier input bias circuit 79. The output of the power amplifier 32 is electrically connected to the output terminal RF_OUT through the impedance matching network 71. For example, the collector of the bipolar transistor 39 is electrically connected to the second harmonic termination circuit 74 and to the fundamental matching circuit 72. The bipolar transistor 39 can be used to amplify a RF signal received on the input terminal RF_IN and to generate an amplifier version of the RF signal on the output terminal RF_OUT. Although the power amplifier 32 is illustrated as including the bipolar transistor 39, in some implementations the bipolar transistor 39 can be omitted in favor of using a field-effect transistor (FET).

The impedance matching network 71 can be used to aid in terminating the electrical connection between the power amplifier 32 and the output terminal RF_OUT. The impedance matching network 71 can be configured to have relatively high load line impedance at the fundamental frequency relative to conventional power amplifier systems. For example, in certain implementations, the impedance matching network 71 can be configured to have an impedance at the RF signal's fundamental frequency that is in the range of about 6 Ω to about 10 Ω, for example, about 8 Ω.

The fundamental matching circuit 72 includes a first inductor 81 and a first capacitor 82, which can be used to control the load line impedance of the power amplifier 32. For example, the first inductor 81 and the first capacitor 82 can have values selected to achieve a desired load line impedance of the power amplifier 32 at the fundamental frequency. The fundamental matching circuit 72 can be used to provide an impedance transformation so as to provide a desired load impedance for the power amplifier 32 when an antenna or other load is electrically connected to the output terminal RF_OUT.

The second harmonic termination circuit 74 includes a second inductor 83 and a second capacitor 84. The second harmonic termination circuit 74 can be tuned to provide a desired impedance at about twice the fundamental frequency of the RF signal amplified by the power amplifier 32. For example, the second inductor 83 and the second capacitor 84 can be configured to have a relatively low impedance, such as an impedance of less than about 0.5 Ω at about twice the fundamental frequency so as to substantially eliminate second-order harmonic signal components from the amplified RF signal generated on the output terminal RF_OUT.

Although FIG. 6 illustrates an implementation in which the impedance matching network 71 includes the fundamental matching circuit 72 and the second harmonic termination circuit 74, the teachings herein are applicable to other configurations of the impedance matching network 71. For example, in some implementations the impedance matching network 71 includes a plurality of harmonic termination circuits, such as harmonic termination circuits for second order, third order, and/or fourth or higher order terms.

As will be described in detail further below with reference to FIG. 8, in one embodiment separate connections are provided between the power amplifier 32 and the fundamental matching circuit 72 and between the power amplifier 32 and each of the harmonic termination circuits. By splitting the load line of the power amplifier 32 in this manner, the overall power efficiency of the power amplifier 32 can be increased by allowing the fundamental matching circuit 72 and each of the harmonic termination circuits to be separately tuned.

The bias network 75 can be included to bias the power amplifier 32 with the power amplifier supply voltage $V_{CC\_PA}$ generated by the envelope tracker 30. The bias network 75 includes a choke inductor 85 and a bypass capacitor 86. The choke inductor 85 can include a first end electrically connected to the envelope tracker 30 and a second end electrically connected to the collector of the bipolar transistor 39. The bypass capacitor 86 includes a first end electrically connected to the first end of the choke inductor 85 and a second end electrically coupled to the first supply voltage $V_1$. The bypass capacitor 86 can be configured to provide a low impedance path to high frequency signals.

Capacitive loading of the power amplifier supply voltage $V_{CC\_PA}$ can result in the envelope tracker 30 having a relatively large size and/or reduced power efficiency. However, some capacitance may be needed local to the power amplifier 32 to reduce noise, to provide stability to the power amplifier 32, and/or to effectively operate the inductor 85 as a choke.

In certain implementations, the bypass capacitor 86 is selected to have a relatively small value relatively to a bypass capacitance used in a conventional power amplifier system. For example, in one embodiment the bypass capacitor 86 is selected to have a capacitance in the range of about 50 pF to about 200 pF, for example, about 100 pF. Accordingly, in contrast to conventional power amplifier systems that can employ a bypass capacitor of a capacitance of 1 µF or more, in certain implementations described herein power amplifier systems are provided with relatively small bypass capacitors.

The power amplifier input bias circuit 79 can be used to provide a bias current to the power amplifier 32. For example, the power amplifier input bias circuit 79 can be used to generate a bias current $I_{BIAS}$ for the base of the bipolar transistor 39. Biasing the power amplifier 32 with a relatively large bias current $I_{BIAS}$ can increase the linearity of the power amplifier 32, but can also reduce the PAE of the power amplifier 32.

In certain implementations, the power amplifier input bias circuit 79 can be configured to dynamically adjust the bias current of the power amplifier 32 in relation to the output signal power level of the power amplifier 32. For example, as will be described below with reference to FIG. 9, in one embodiment the power amplifier input bias circuit 79 can be configured to decrease a magnitude of the bias current $I_{BIAS}$ when the output signal power level of the power amplifier 32 decreases.

Figure 7:
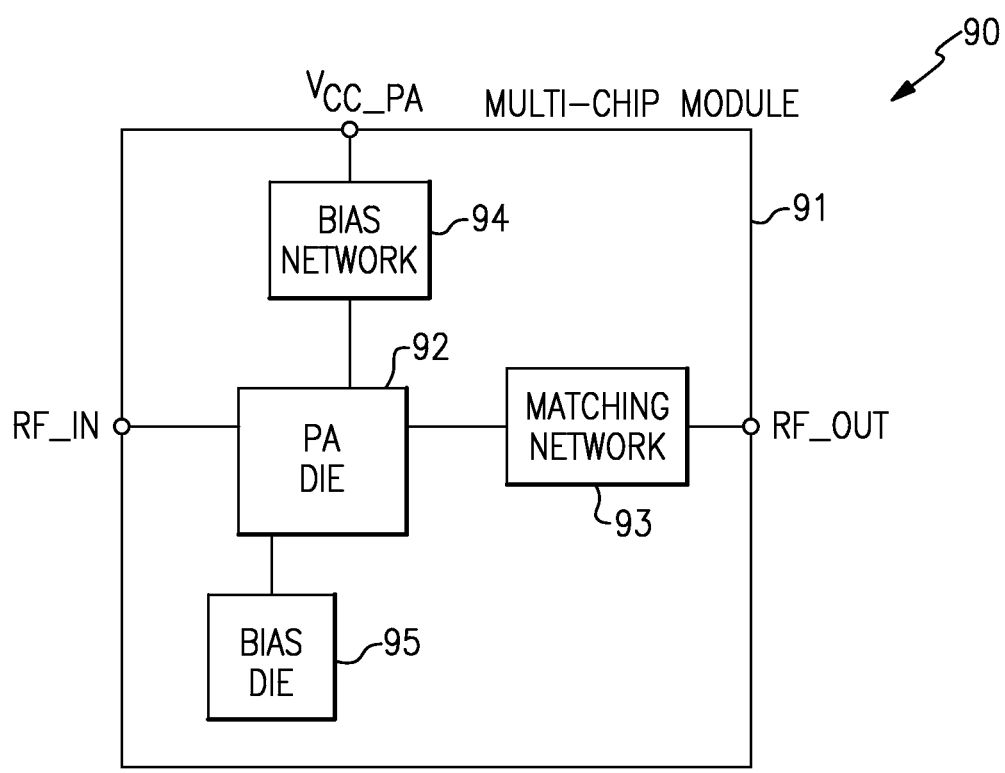
FIG. 7 is a schematic block diagram of one example of a multi-chip module (MCM).

FIG. 7 is a schematic block diagram of one example of a multi-chip module (MCM) 90. The illustrated MCM 90 includes a MCM substrate 91, a power amplifier die 92, an impedance matching network 93, a bias network 94, and a power amplifier bias die 95. The MCM 90 further includes a power supply pin $V_{CC\_PA}$, an input pin RF_IN, and an output pin RF_OUT. In certain implementations, the power supply pin $V_{CC\_PA}$ can be electrically connected to an envelope tracker, such as an envelope tracking module disposed on a phone board.

The power amplifier die 92 can be mounted on the MCM substrate 91, and can include one or more power amplifiers for amplifying a RF signal received on the input pin RF_IN to generate an amplified RF signal on the output pin RF_OUT. For example, the power amplifier die 92 can be a gallium arsenide (GaAs) die including heterojunction bipolar transistors (HBT).

The impedance matching network 93 can be used to aid in terminating the electrical connection between the power amplifier die 92 and the output pin RF_OUT. The impedance matching network 93 can also be configured to achieve a desired load line impedance characteristic versus frequency for the power amplifier die 92, thereby impacting the efficiency of the MCM 90. The impedance matching network 93 can include an inductive component and a capacitive component. The inductive component can be formed, for example, using trace disposed on the MCM substrate 91, using one or more bond wires, and/or using one or more surface mount components. The capacitive component can be formed, for example, using one or more surface mount components. In some implementations, the impedance matching network 93 is configured to have a load line impedance in the range of about 6 Ω to about 10 Ω, for example, about 8 Ω.

The bias network 94 can be used to aid in biasing the power amplifier die 92 with a power supply voltage received on the power supply pin $V_{CC\_PA}$, as was described earlier. In certain implementations the bias network 94 includes an inductor formed using trace disposed on the MCM substrate 91 of the MCM 90. Although the bias network 94 can include an inductor from trace, the bias network 94 can include an inductor formed in other ways, such as by use of one or more surface mount components and/or by use of one or more bond wires. The bias network 94 can also include a capacitor for decoupling the power supply voltage from the power supply pin $V_{CC\_PA}$, such as a capacitor formed using one or more surface mount components.

The power amplifier bias die 95 can be mounted on the MCM substrate 91, and can be used, for example, to enable and disable one or more power amplifiers disposed on the power amplifier die 92 and/or to provide bias signals to the power amplifier die 92. For example, in a bipolar transistor configuration, the power amplifier bias die 95 can be used to provide a reference voltage for biasing a current mirror used to generate a base current for the power amplifiers. Accordingly, the power amplifier bias die 95 can be used to generate a bias signal for controlling a quiescent current of the power amplifier die 92.

Although FIG. 7 illustrates a configuration in which the MCM 90 includes the power supply pin $V_{CC\_PA}$ for receiving a power supply voltage from an envelope tracker, in other configurations an envelope tracking die can be mounted on the MCM substrate 91.

Figure 8:
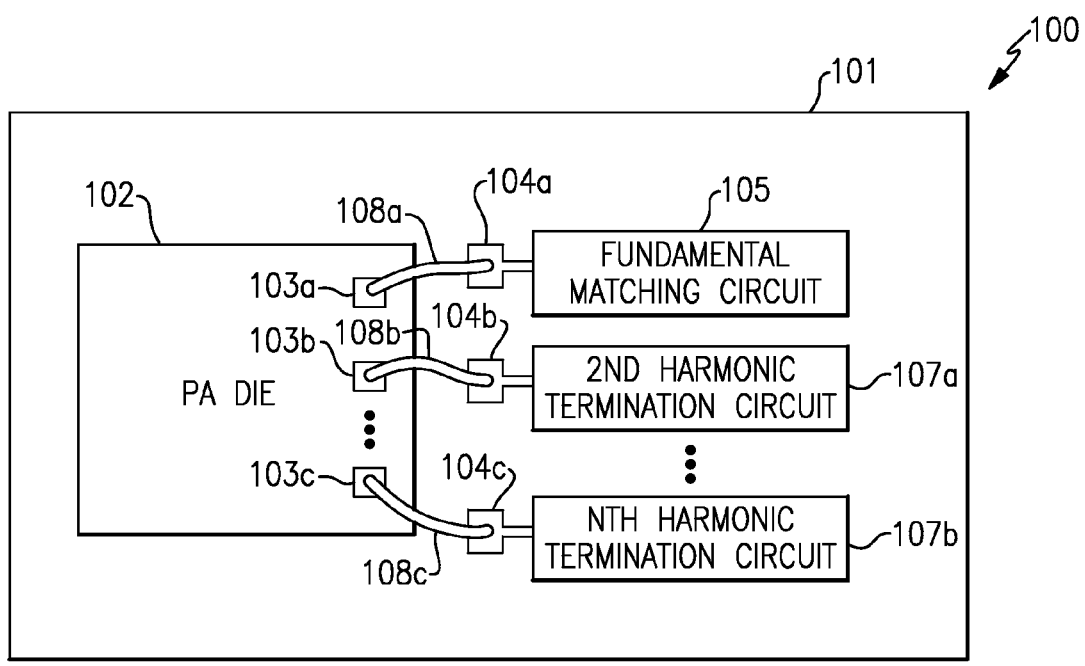
FIG. 8 is a schematic block diagram of one example of a portion of a MCM.

FIG. 8 is a schematic block diagram of one example of a portion of a MCM 100. The MCM 100 includes a MCM substrate 101, a power amplifier die 102, a first trace 104a, a second trace 104b, a third trace 104c, a fundamental matching circuit 105, a second harmonic termination circuit 107a, an Nth harmonic termination circuit 107b, a first bond wire 108a, a second bond wire 108b, and a third bond wire 108c. The power amplifier die 102 includes a first pad 103a, a second pad 103b, and a third pad 103c, which can be electrically connected to a common node within the power amplifier die 102. For example, in a bipolar transistor configuration, the first pad 103a, the second pad 103b, and the third pad 103c can each be electrically connected to a collector of a bipolar transistor.

The output signal of a power amplifier can include a fundamental frequency component and one or more harmonic frequency components. Some conventional power amplifier systems have included a single termination circuit to provide impedance matching at a fundamental frequency of the power amplifier output signal and to terminate one or more harmonic frequencies of the power amplifier output signal.

However, it can be difficult to tune the single termination circuit to both provide impedance matching at the fundamental frequency of the power amplifier output signal and to terminate the harmonic frequencies of the power amplifier output signal in a way that optimizes both PAE and linearity. For example, since a bond wire can have an inductance that impacts the impedance of a termination circuit, using a bond wire to connect to the single termination circuit can result in it being difficult or impossible to optimally tune the single termination circuit for fundamental and harmonic frequencies.

In the configuration illustrated in FIG. 8, the power amplifier die 102 includes separate fundamental matching and harmonic termination circuits. For example, the power amplifier die 102 includes the first pad 103a and the first bond wire 108a for electrically connecting to the first trace 104a and to the fundamental matching circuit 105, which can be configured to provide signal termination at a fundamental frequency. Additionally, the power amplifier die 102 includes the second pad 103b and the second bond wire 108b for electrically connecting to the second trace 104b and to the second harmonic termination circuit 107a, and the third pad 103c and the third bond wire 108c for electrically connecting to the third trace 104c and to the Nth harmonic termination circuit 107b.

Although the first, second and third pads 108a-108c can be electrically connected to one another and to the output of a power amplifier within the power amplifier die 102, each of the first, second and third pads 108a-108c can include separate bond wires for connecting to separate matching circuits on the MCM substrate 101. Providing separate fundamental matching and harmonic termination circuits for the power amplifier die 102 can improve the PAE and/or linearity of the power amplifier die 102 by allowing circuit elements of the fundamental matching and harmonic termination circuits to be separately tuned for optimization.

Although FIG. 8 illustrates a configuration including two harmonic termination circuits 107a, 107b, more or fewer harmonic termination circuits can be included in the MCM 100. For example, in some implementations the MCM 100 includes separate circuits for fundamental frequency matching and for second harmonic termination, while in other implementations the MCM 100 includes separate circuits for each of fundamental frequency matching, second harmonic termination and third harmonic termination.

In one embodiment, the MCM 100 includes separate harmonic termination circuits for even or odd harmonic frequencies while providing no harmonic termination for the other of the even or odd harmonic frequencies. For example, in a class F configuration, the MCM 100 can include separate circuits for fundamental frequency matching and for terminating at least one even harmonic frequency, while providing no harmonic termination for odd harmonic frequencies. Additionally, in an inverted class F configuration, the MCM 100 can include separate circuits for fundamental frequency matching and for terminating at least one odd harmonic frequency, while providing no harmonic termination for even harmonic frequencies.

Although FIG. 8 illustrates a configuration in which the fundamental matching circuit and the harmonic termination circuits are connected to separate pads of the IC, in certain implementations, the fundamental matching circuit and the harmonic termination circuits can be electrically connected to a single pin or pad of the die using different bond wires.

Figure 9:
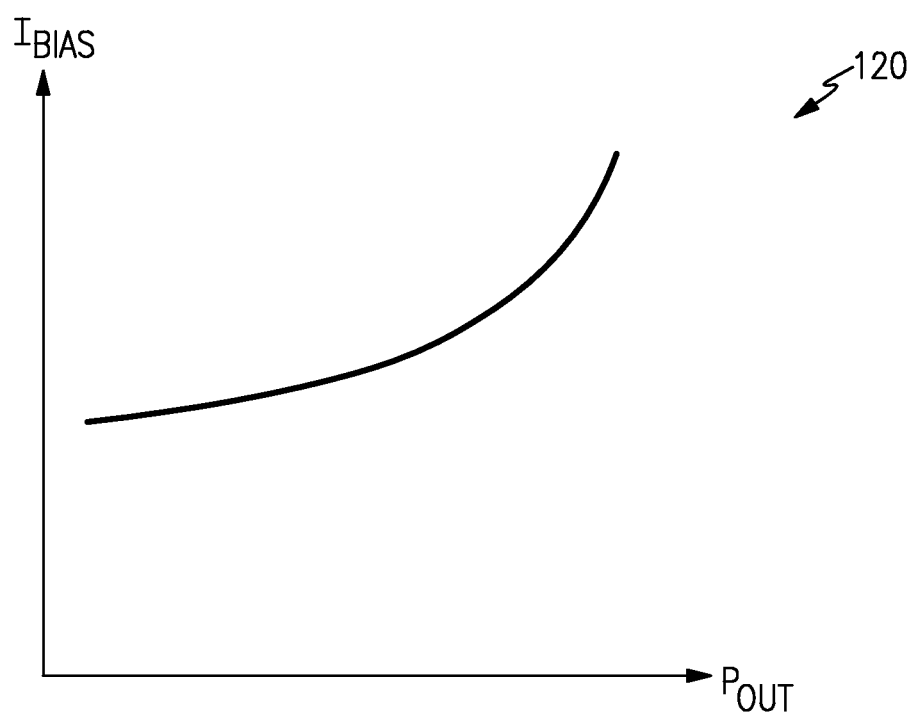
FIG. 9 shows an example of output power versus bias current for one example of a power amplifier system.

FIG. 9 shows an example of output power versus bias current for one example of a power amplifier system. The graph 120 of output power versus bias current can represent an example of the magnitude of the bias current $I_{BIAS}$ of the power amplifier input bias circuit 79 of FIG. 6 versus output power of the RF signal RF_OUT of FIG. 6.

As illustrated in the graph 120 of FIG. 9, the bias current can decrease as the output power $P_{OUT}$ decreases. In certain configurations, the linearity of a power amplifier system with an envelope tracker can increase at low output power levels. Accordingly, the bias current $I_{BIAS}$ of the power amplifier system can be decreased at low output power levels to increase power efficiency while maintaining a linearity above a threshold, such as a threshold associated with a linearity rating of the power amplifier system.

Applications

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier circuit assembly comprising:
a power amplifier including an input and an output, the input configured to receive a radio frequency signal having a fundamental frequency and the output configured to provide an amplified radio frequency signal; and
an impedance matching network operatively associated with the power amplifier and configured to provide a load line impedance between about 6 Ω and about 10 Ω at the fundamental frequency, the impedance matching network including a fundamental matching circuit and one or more termination circuits, the fundamental matching circuit and each of the of the one or more termination circuits including separate input terminals for coupling to the output of the power amplifier so as to allow the fundamental matching circuit and each of the one or more termination circuits to be separately tuned.

2. The power amplifier circuit assembly of claim 1 wherein the one or more termination circuits includes a second harmonic termination circuit and a third harmonic termination circuit.

3. The power amplifier circuit assembly of claim 1 further comprising an envelope tracker configured to generate a power supply voltage for the power amplifier.

4. The power amplifier circuit assembly of claim 3 further comprising a bias network for supplying the power amplifier with the power supply voltage, the bias network including a choke inductor electrically connected between the envelope tracker and the power amplifier and a bypass capacitor electrically connected between the power supply voltage and a ground node.

5. The power amplifier circuit assembly of claim 4 wherein the bypass capacitor has a capacitance in the range of about 50 pF to about 200 pF.

6. The power amplifier circuit assembly of claim 1 further comprising an input bias circuit configured to generate a bias current for the input of the power amplifier, the input bias circuit configured to decrease a magnitude of the bias current when a power level of the amplified radio frequency signal decreases.

7. A mobile device comprising:
a power amplifier including an input and an output, the input configured to receive a radio frequency signal having a fundamental frequency and the output configured to provide an amplified radio frequency signal;
an impedance matching network operatively associated with the power amplifier and configured to provide a load line impedance between about 6 Ω and about 10 Ω at the fundamental frequency, the impedance matching network including a fundamental matching circuit and one or more termination circuits, the fundamental matching circuit and each of the of the one or more termination circuits including separate input terminals for coupling to the output of the power amplifier so as to allow the fundamental matching circuit and each of the one or more termination circuits to be separately tuned;
an antenna electrically connected to the output of the power amplifier through the impedance matching circuit; and
an envelope tracker configured to generate a power supply voltage for the power amplifier.

8. The mobile device of claim 7 further comprising a bias network for supplying the power amplifier with the power supply voltage, the bias network including a choke inductor electrically connected between the envelope tracker and the power amplifier and a bypass capacitor electrically connected between the power supply voltage and a ground node.

9. The mobile device of claim 8 wherein the bypass capacitor has a capacitance in the range of about 50 pF to about 200 pF.

10. The mobile device of claim 7 wherein the power amplifier is embodied on a power amplifier die and the fundamental matching circuit and each of the one or more termination circuits are external to the power amplifier die, the fundamental matching circuit and the one or more termination circuit each including a different bond wire electrically connected to the output of the power amplifier.

11. The mobile device of claim 7 wherein the one or more termination circuits includes a second harmonic termination circuit and a third harmonic termination circuit.

12. The mobile device of claim 7 further comprising a transceiver configured to generate the radio frequency input signal.

13. The mobile device of claim 7 further comprising an input bias circuit configured to generate a bias current for the input of the power amplifier, the input bias circuit configured to decrease a magnitude of the bias current when a power level of the amplified radio frequency signal decreases.

14. A multi-chip module comprising:
a substrate;
an input pin configured to receive a radio frequency signal having a fundamental frequency;
a power amplifier die mounted on the substrate, the power amplifier die including an input electrically connected to the input pin and an output configured to provide an amplified radio frequency signal; and
an impedance matching network disposed on the substrate and electrically connected to the output of the power amplifier, the impedance matching network configured to provide a load line impedance between about 6 Ω and about 10 Ω at the fundamental frequency, the impedance matching network including a fundamental matching circuit and one or more termination circuits, the fundamental matching circuit and each of the of the one or more termination circuits including separate input terminals for coupling to the output of the power amplifier so as to allow the fundamental matching circuit and each of the one or more termination circuits to be separately tuned.

15. The multi-chip module of claim 14 wherein the impedance matching network includes an inductive circuit component and a capacitive circuit component, and the capacitive circuit component is formed from a surface mount component mounted on the substrate.

16. The multi-chip module of claim 14 wherein the impedance matching network includes an inductive circuit component and a capacitive circuit component, and the inductive circuit component includes a spiral inductor formed from a conductive trace of the substrate.

17. The multi-chip module of claim 14 wherein the impedance matching network includes an inductive circuit component and a capacitive circuit component, and the inductive circuit component includes a surface mount component mounted to the substrate.

18. The multi-chip module of claim 14 further comprising a power supply pin and a ground pin, the power supply pin configured to receive a power supply voltage from an envelope tracker.

19. The multi-chip module of claim 18 further comprising a bias network for supplying the power amplifier with the power supply voltage, the bias network including a choke inductor electrically connected between the power supply pin and the power amplifier and a bypass capacitor electrically connected between the power supply pin and the ground pin.

20. The multi-chip module of claim 19 wherein the bypass capacitor has a capacitance in the range of about 50 pF to about 200 pF.

21. The multi-chip module of claim 14 wherein the fundamental matching circuit and each of the one or more termination circuits each include a different bond wire electrically connected to the output of the power amplifier.

22. The multi-chip module of claim 21 wherein the fundamental matching circuit and each of the one or more termination circuits are electrically connected to the power amplifier die using different pads of the power amplifier die.

23. The multi-chip module of claim 14 further comprising a power amplifier bias die disposed on the substrate and configured to provide a bias signal for controlling a quiescent current of the power amplifier die.

24. A tuning circuit assembly for use in a power amplifier system, the tuning circuit assembly comprising:
an impedance matching network operatively associated with a power amplifier and configured to provide a load line impedance between about 6 Ω and about 10 Ω, the impedance matching network including a fundamental matching circuit and one or more termination circuits, the fundamental matching circuit and each of the of the one or more termination circuits including separate terminals for coupling to an output of the power amplifier so as to allow the fundamental matching circuit and each of the one or more termination circuits to be separately tuned; and
a biasing network operative associated with said impedance matching network, the biasing network operatively associated with an envelope tracker and configured to provide a bypass capacitance in the range of about 50 pF to about 200 pF.

25. The tuning circuit assembly of claim 24 wherein the one or more termination circuits include a plurality of termination circuits for even harmonics but do not include any termination circuits for odd harmonics.

26. The tuning circuit assembly of claim 24 wherein the one or more termination circuits include a plurality of termination circuits for odd harmonics but do not include any termination circuits for even harmonics.

27. The tuning circuit assembly of claim 24 wherein the one or more termination circuits include a second harmonic termination circuit and a third harmonic termination circuit.

\* \* \* \* \*

UNITED STATES PATENT AND TRADEMARK OFFICE
CERTIFICATE OF CORRECTION

PATENT NO. : 9,083,282 B2  Page 1 of 1
APPLICATION NO. : 13/666627
DATED : July 14, 2015
INVENTOR(S) : Guohao Zhang et al.

It is certified that error appears in the above-identified patent and that said Letters Patent is hereby corrected as shown below:

Title Page

Page 1, item 56, Cited References at line 9, under Other Publications, change "Multimore" to --Multimode--.

Page 1 (item 57, Abstract) at lines 9-10, change "of the of the" to --of the--.

In the Specification

In column 1 at line 63, change "of the of the" to --of the--.

In column 2 at line 37, change "of the of the" to --of the--.

In column 3 at lines 15-16 (approx.), change "of the of the" to --of the--.

In column 3 at line 20, change "component," to --component--.

In column 3 at line 60-61, change "of the of the" to --of the--.

In the Claims

In column 15 at line 37, in Claim 1, change "of the of the" to --of the--.

In column 16 at line 9, in Claim 7, change "of the of the" to --of the--.

In column 16 at line 60, in Claim 14, change "of the of the" to --of the--.

In column 18 at line 12, in Claim 24, change "of the of the" to --of the--.

Signed and Sealed this
Fifth Day of April, 2016

Michelle K. Lee
*Director of the United States Patent and Trademark Office*